(12) United States Patent
Tomabechi (10) Patent No.: US 12,316,359 B2
(45) Date of Patent: May 27, 2025

(54) COMMUNICATION SYSTEM AND COMMUNICATION APPARATUS

(71) Applicant: CANON KABUSHIKI KAISHA, Tokyo (JP)

(72) Inventor: Masaru Tomabechi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 228 days.

(21) Appl. No.: 18/149,578

(22) Filed: Jan. 3, 2023

(65) Prior Publication Data

US 2023/0238174 A1   Jul. 27, 2023

(30) Foreign Application Priority Data

Jan. 24, 2022  (JP) ................... 2022-008691

(51) Int. Cl.
| | |
|---|---|
| *H04B 1/04* | (2006.01) |
| *H01P 5/18* | (2006.01) |
| *H03H 7/06* | (2006.01) |
| *H01F 38/14* | (2006.01) |

(52) U.S. Cl.
CPC ............ *H04B 1/0475* (2013.01); *H01P 5/18* (2013.01); *H03H 7/06* (2013.01); *H01F 2038/143* (2013.01)

(58) Field of Classification Search
CPC .......... H03H 7/06; H01P 5/18; H04B 1/0475; H04B 1/00
USPC .................. 333/109–112; 455/41.1
See application file for complete search history.

(56) References Cited

U.S. PATENT DOCUMENTS

2020/0127703 A1* 4/2020 Yukimasa ............. A61B 6/56

FOREIGN PATENT DOCUMENTS

JP   2009-239763 A   10/2009

* cited by examiner

*Primary Examiner* — Rakesh B Patel
(74) *Attorney, Agent, or Firm* — Canon U.S.A., Inc. IP Division (57) ABSTRACT

A communication system includes a transmission unit configured to output a signal, an attenuation unit configured to attenuate the signal output from the transmission unit, a first coupler having one end portion being connected to the transmission unit via the attenuation unit, a termination unit that is connected to the other end portion of the first coupler, and a second coupler configured to input a signal to the first coupler using at least one of electric field coupling and magnetic field coupling, wherein the first coupler or the second coupler is configured to be movable so that a relative position between the first coupler and the second coupler changes.

15 Claims, 5 Drawing Sheets

FIG.5

COMMUNICATION SYSTEM AND COMMUNICATION APPARATUS

BACKGROUND

Field of the Disclosure

The present disclosure relates to a communication system and a communication apparatus.

Description of the Related Art

Known is a communication system that uses electromagnetic field coupling to perform wireless communication between apparatuses in proximity to each other. With this communication system, execution of wireless data transmission in a robot arm portion and a pivotable portion of a network camera or the like enables reduction of abrasion of a cable and implementation of free pivoting.

Examples of the communication system include a configuration in which couplers for communication face each other and in which wireless communication is implemented from a fixed unit to another fixed unit, from a moving unit to the fixed unit, or from the moving unit to another moving unit. At least one of the moving unit or the fixed unit includes transmission lines that extend in a moving direction on a substrate, and is capable of performing proximity communication with an electrode that is coupled to at least one of the transmission lines through a magnetic field, an electric field, or both the magnetic field and the electric field. At this time, in a case where there are impedance mismatch points in the transmission lines at the periphery of a connection portion between a transmission circuit and the transmission lines, or the like, a signal is reflected, a signal waveform is disturbed, and communication quality is deteriorated. Japanese Patent Application Laid-Open No. 2009-239763 discusses a technique of reducing the influence of reflection using a variable attenuator arranged between an amplifier and a mixer and.

In the above-mentioned communication system, however, a transmission characteristic between a transmission side and a reception side, together with a reflection characteristic, changes depending on a position of a short coupler. Thus, in a case where the variable attenuator is controlled to reduce only reflection, there is a possibility that the communication quality is deteriorated.

SUMMARY

The present disclosure provides a technique that can improve signal waveform quality and communication quality.

According to an aspect of the present disclosure, a communication system includes a transmission unit configured to output a signal, an attenuation unit configured to attenuate the signal output from the transmission unit, a first coupler having one end portion being connected to the transmission unit via the attenuation unit, a termination unit that is connected to the other end portion of the first coupler, and a second coupler configured to input a signal to the first coupler using at least one of electric field coupling and magnetic field coupling, wherein the first coupler or the second coupler is configured to be movable so that a relative position between the first coupler and the second coupler changes.

Further features of the present disclosure will become apparent from the following description of embodiments with reference to the attached drawings.

DESCRIPTION OF THE EMBODIMENTS

Figure 1:
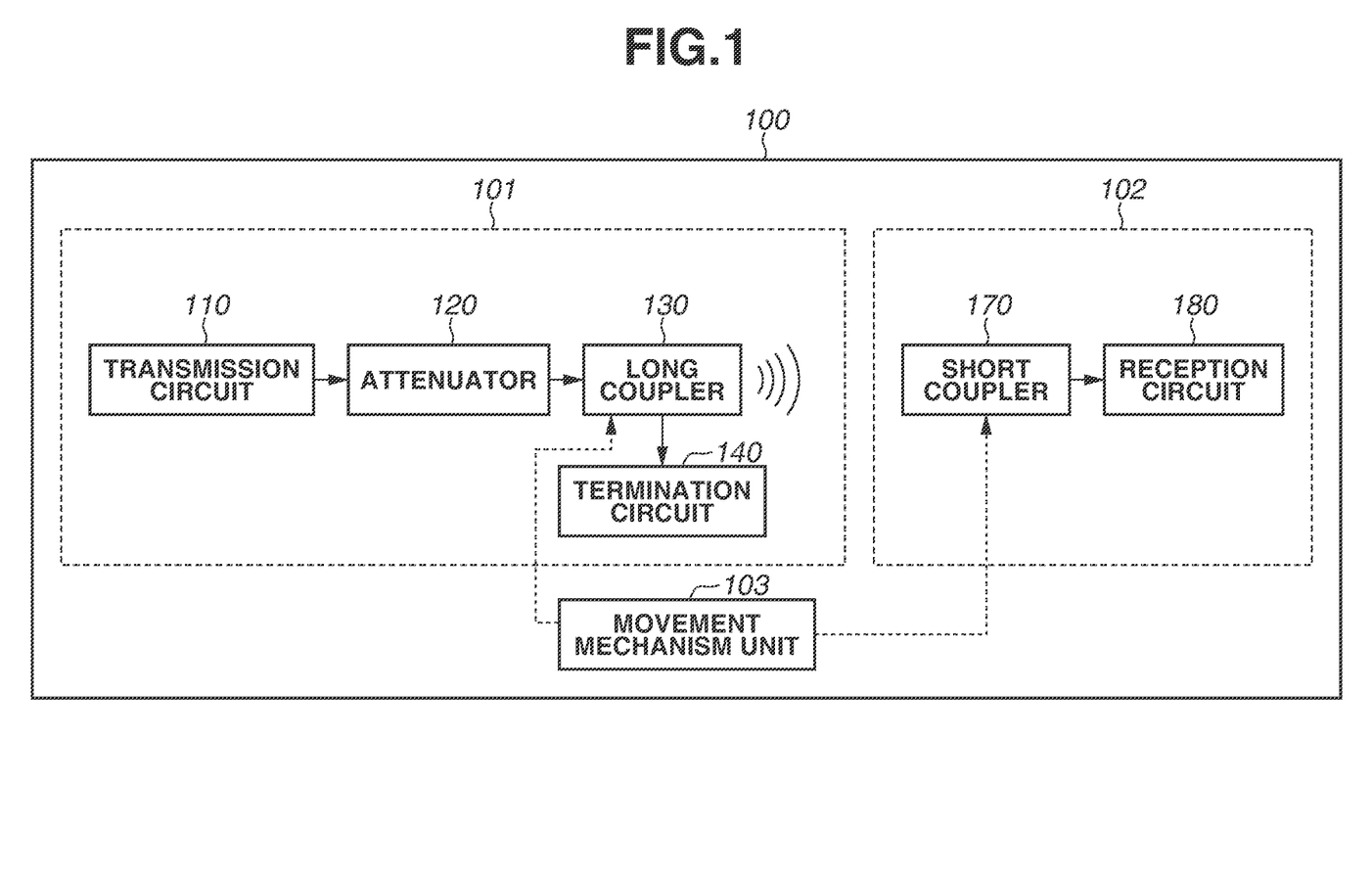
FIG. 1 is a block diagram illustrating a configuration example of a communication system.

FIG. 1 is a diagram illustrating a configuration example of a communication system 100 according to a first embodiment. The communication system 100 uses electromagnetic field coupling between a long coupler and a short coupler to perform wireless communication.

The electromagnetic field coupling in the present embodiment includes both electric field coupling and magnetic field coupling. That is, wireless communication may be performed using the electric field coupling, the magnetic field coupling, or both of the electric field coupling and the magnetic field coupling. The communication system 100 includes a communication apparatus 101 on a transmission side, a communication apparatus 102 on a reception side, and a movement mechanism unit 103.

The communication apparatus 101 on the transmission side includes a transmission circuit 110, an attenuator 120, a long coupler 130, and a termination circuit 140. The communication apparatus 102 on the reception side includes a short coupler 170 and a reception circuit 180. The communication apparatus 101 on the transmission side and the communication apparatus 102 on the reception side may be a first portion and a second portion of a single apparatus, respectively, or may be different apparatuses.

The communication system 100 includes a support structure for maintaining a predetermined positional relationship between the communication apparatus 101 on the transmission side and the communication apparatus 102 on the reception side (positional relationship in which the long coupler 130 and the short coupler 170 face each other). For example, the communication system 100 is a gantry loader, the communication apparatus 101 on the transmission side is a traveling unit, and the communication apparatus 102 on the reception side is a fixed unit. As another example, the communication system 100 is a surveillance camera, a robot arm, or the like, and apparatuses to which the communication system 100 is applied are not limited to the above examples.

The long coupler 130 is coupled to the short coupler 170 using the electromagnetic field coupling, and thereby functions as an antenna for implementing wireless communication between the communication apparatus 101 on the transmission side and the communication apparatus 102 on the reception side. The transmission circuit 110 generates an electric signal, and inputs the electric signal to one end portion (input terminal) of the long coupler 130 via the attenuator 120. The attenuator 120 attenuates the electric signal received from the transmission circuit 110 by a set amount of attenuation and outputs the attenuated electric signal to the long coupler 130.

The transmission circuit 110 can be formed by a combination of a signal source, a differential buffer, an amplifier, a distributor, and the like, and is capable of controlling amplitude of an output signal. A method of controlling a signal from the transmission circuit 110 is not limited to the above-described method, and may be implemented by software or another hardware configuration.

The termination circuit 140 is connected to the other end portion (output terminal) of the long coupler 130. When a signal is input to the input terminal of the long coupler 130 from the transmission circuit 110 via the attenuator 120, the signal is transmitted in a direction toward the other end portion (output terminal) of the long coupler 130. That is, the long coupler 130 functions as a transmission line that transmits a signal.

The reception circuit 180 restores a voltage generated in the short coupler 170 into an electric signal using the electromagnetic field coupling in response to input of the electric signal to the long coupler 130. The electric signal restored by the reception circuit 180 is a signal that is equivalent to the electric signal output from the transmission circuit 110. The reception circuit 180 is capable of restoring the electric signal using a comparator or another circuit. In this manner, the transmission circuit 110 and the reception circuit 180 perform wireless communication using the electromagnetic field coupling between the long coupler 130 and the short coupler 170.

The movement mechanism unit 103 moves at least one of the communication apparatus 101 on the transmission side and the communication apparatus 102 on the reception side in a predetermined direction, and can thereby change the positional relationship between the long coupler 130 and the short coupler 170. For example, the movement mechanism unit 103 includes a rail that supports the communication apparatus 101, a motor for moving the communication apparatus 101 or 102 along the rail, and a power source that supplies power to the motor, and is capable of changing a relative position between the communication apparatus 101 and the communication apparatus 102. The configuration of the movement mechanism unit 103, however, is not limited to the above-described example. For example, the movement mechanism unit 103 may have a configuration including only the rail without the motor. In addition, the movement mechanism unit 103 may directly move the long coupler 130, the short coupler 170, or both of the long coupler 130 and the short coupler 170, instead of moving the whole of the communication apparatus 101 or the communication apparatus 102.

The configuration of the communication apparatus 101 on the transmission side and the communication apparatus 102 on the reception side is not limited to the configuration for performing unidirectional communication as illustrated in FIG. 1. The communication system 100 may have a configuration in which the communication apparatus 102 further includes a long coupler, the communication apparatus 101 further includes a short coupler, and bidirectional communication is performed.

A configuration is to be described for transmitting a signal from the communication apparatus 101 on the transmission side to the communication apparatus 102 on the reception side, but the same applies to a configuration for transmitting a signal from the communication apparatus 102 on the reception side to the communication apparatus 101 on the transmission side. However, the configuration for transmitting a signal from the communication apparatus 101 to the communication apparatus 102 and the configuration for transmitting a signal from the communication apparatus 102 to the communication apparatus 101 do not have to be identical to each other.

Figure 2:
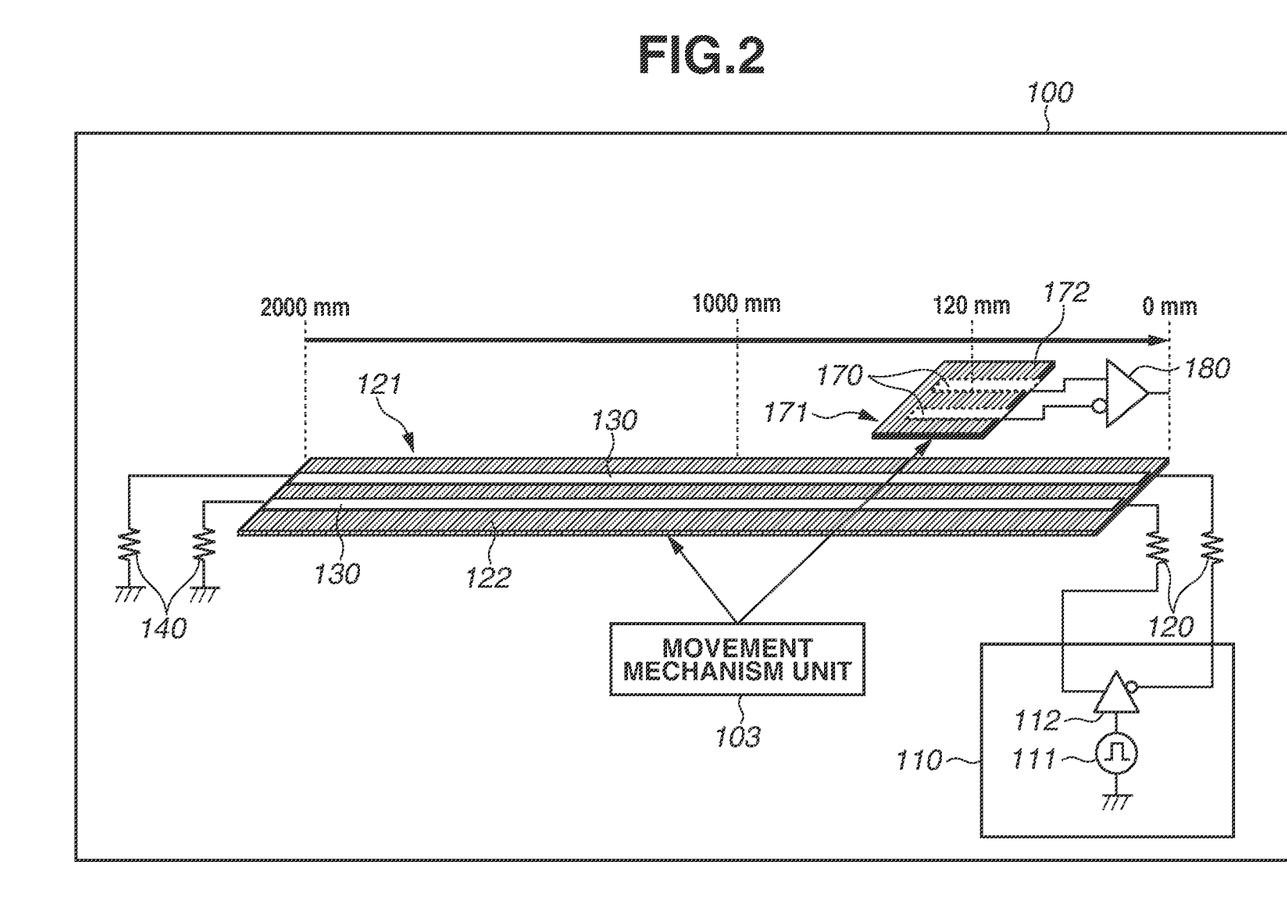
FIG. 2 is a diagram illustrating a configuration example of the communication system.

FIG. 2 is a diagram illustrating a configuration example of the communication system 100. The configuration of the long coupler 130 and short coupler 170 and a setting of an amount of attenuation of the attenuator 120 will be described with reference to FIG. 2.

The transmission circuit 110 includes a signal source 111 and a differential buffer 112, and inputs differential signals to respective end portions of two long couplers 130 via respective attenuators 120. The signal source 111 outputs a signal. The differential buffer 112 takes input of a signal output from the signal source 111, and outputs differential signals to the respective end portions of the two long couplers 130 via the respective attenuators 120. Each attenuator 120 is, for example, a resistor.

The long coupler 130 is a conductive member arranged on one surface of a substrate 121. A grounding terminal 122 is arranged on the other surface of the substrate 121. The transmission circuit 110 is connected to the one end portion (input terminal) of the long coupler 130 via the attenuator 120. The termination circuit 140 is connected to the other end portion (output terminal) of the long coupler 130. The termination circuit 140 is, for example, a termination resistor. A length of the long coupler 130 is, for example, 2000 mm, but is not limited to 2000 mm.

When the differential signal is input from the transmission circuit 110 to the input terminal of the long coupler 130 via the attenuator 120, the differential signal is transmitted in a direction to the output terminal of the long coupler 130 (direction from 0 mm to 2000 mm in FIG. 2). That is, the long coupler 130 functions as a signal line of a transmission line for the differential signal. The long coupler 130 mentioned herein is a differential microstrip line, but is not limited to a differential microstrip line. For example, the long coupler 130 may be a stripline or a single-end transmission line.

The other end portion of the long coupler 130 is terminated by the termination circuit 140. In FIG. 2, the termination circuit 140 is configured so that a resistor of 50Ω that is approximately equal to characteristic impedance of the long coupler 130 is grounded. A circuit configuration of the termination circuit 140 is not limited to the configuration illustrated in FIG. 2. The termination circuit 140 may employ topological termination such as Thevenin termination, T-type termination, and Π-type termination.

Two short couplers 170 are conductive members arranged on one surface of a substrate 171. A grounding terminal 172 made of a metal member is arranged on the other surface of the substrate 171. When differential signals flow in the long couplers 130, electric charges are generated in the short couplers 170 by the electromagnetic field coupling. Then, the reception circuit 180 connected to the short couplers 170 outputs a signal. That is, each short coupler 170 functions as an electrode constituting a capacitor. The configuration of the short coupler 170, however, is not limited to the above-described configuration. Another configuration may be that the reception circuit 180 is connected to one end portion of the short coupler 170, a termination resistor is connected to the other end portion of the short coupler 170, and the short coupler 170 functions as a signal line of the transmission line.

A length of the short coupler 170 in an extending direction of the long coupler 130 (direction from 0 mm to 2000 mm in FIG. 2) is smaller than the length of the long coupler 130.

From a view point in a direction perpendicular to a transmission direction of the differential signal in the long coupler 130, the long coupler 130 and the short coupler 170 have a positional relationship in which the long coupler 130 and the short coupler 170 at least partially overlap with each other.

The movement mechanism unit 103 changes the relative position of the short coupler 170 to the long coupler 130 in the transmission direction of the differential signal in the long coupler 130. For example, the movement mechanism unit 103 is capable of moving the short coupler 170 in a range in which the short coupler 170 and the long coupler 130 face each other (direction from 0 mm to 2000 mm in FIG. 2). The range for movement, however, is not limited to the above-described range, and the short coupler 170 may be moved only in a partial range above the long coupler 130, or the short coupler 170 may be moved to the outside above the long coupler 130. The moving method of the movement mechanism unit 103 is not limited to the above-described method.

A signal received in the short coupler 170 is influenced by attenuation of a signal in the long coupler 130 and reflection due to impedance mismatch. Examples of a portion where the impedance mismatch is likely to occur include a connection portion between the attenuator 120 and the long coupler 130, and the transmission line in the long coupler 130 immediately below the short coupler 170. Especially when the short coupler 170 is close to the input terminal of the long coupler 130, a disturbance of a waveform due to multiple reflection is likely to occur. As the short coupler 170 becomes closer to the output terminal of the long coupler 130, the signal is more influenced by signal attenuation.

Figure 3:
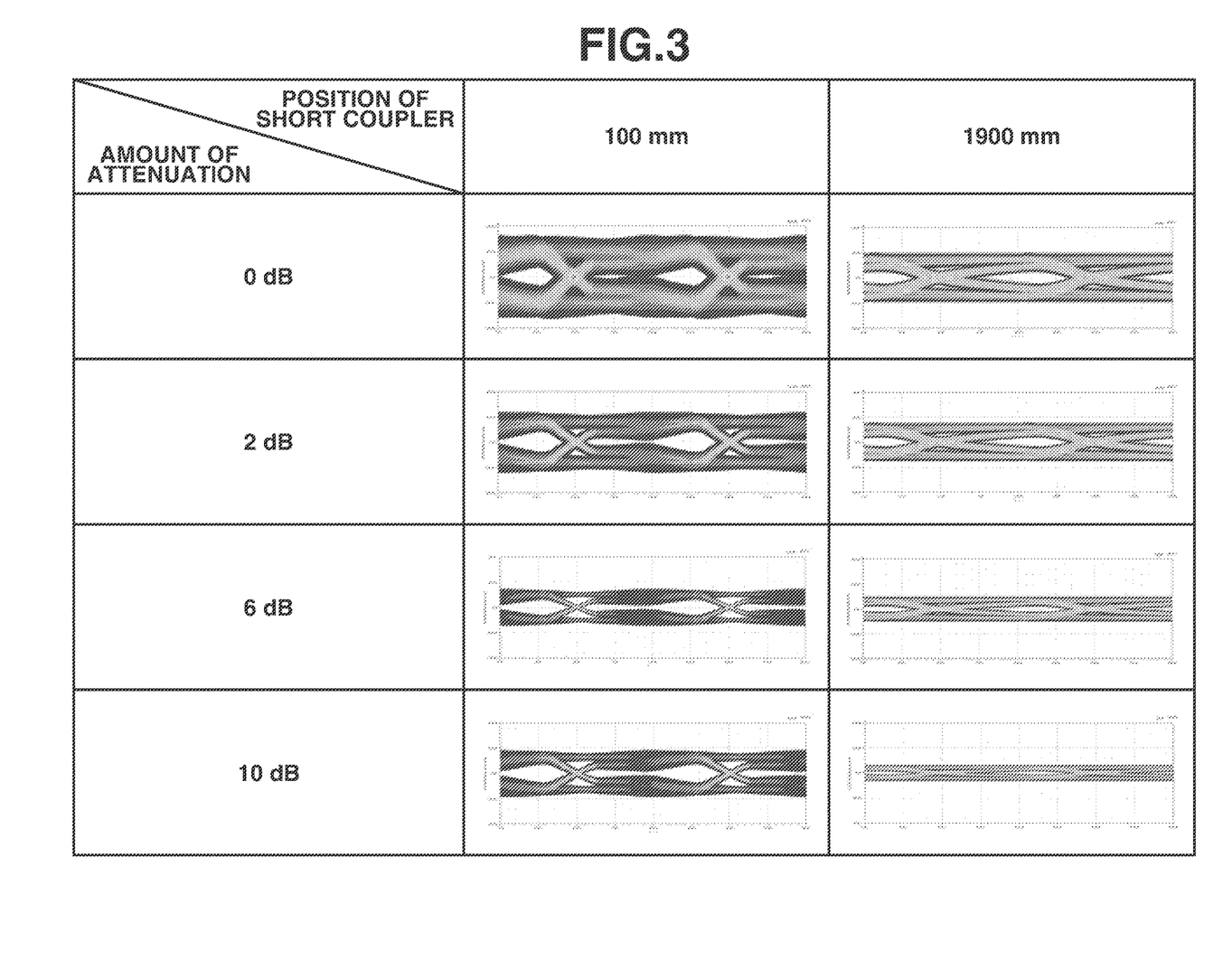
FIG. 3 is a diagram illustrating waveform examples in the communication system.

FIG. 3 is a diagram illustrating examples of results of simulating eye patterns of a received signal in the short coupler 170 with respect to the position of the short coupler 170 and the amount of attenuation of the attenuator 120. FIG. 3 illustrates eye patterns of the received signal in the short coupler 170 when the short coupler 170 is at a position of 100 mm away from the input terminal of the long coupler 130 and the amount of attenuation of the attenuator 120 is changed. FIG. 3 also illustrates eye patterns of the received signal in the short coupler 170 when the short coupler 170 is at a position of 1900 mm away from the input terminal of the long coupler 130 and the amount of attenuation of the attenuator 120 is changed. The amount of attenuation of the attenuator 120 represents an amount of attenuation in an eye pattern of the signal in the long coupler 130 immediately below the short coupler 170.

Figure 4:
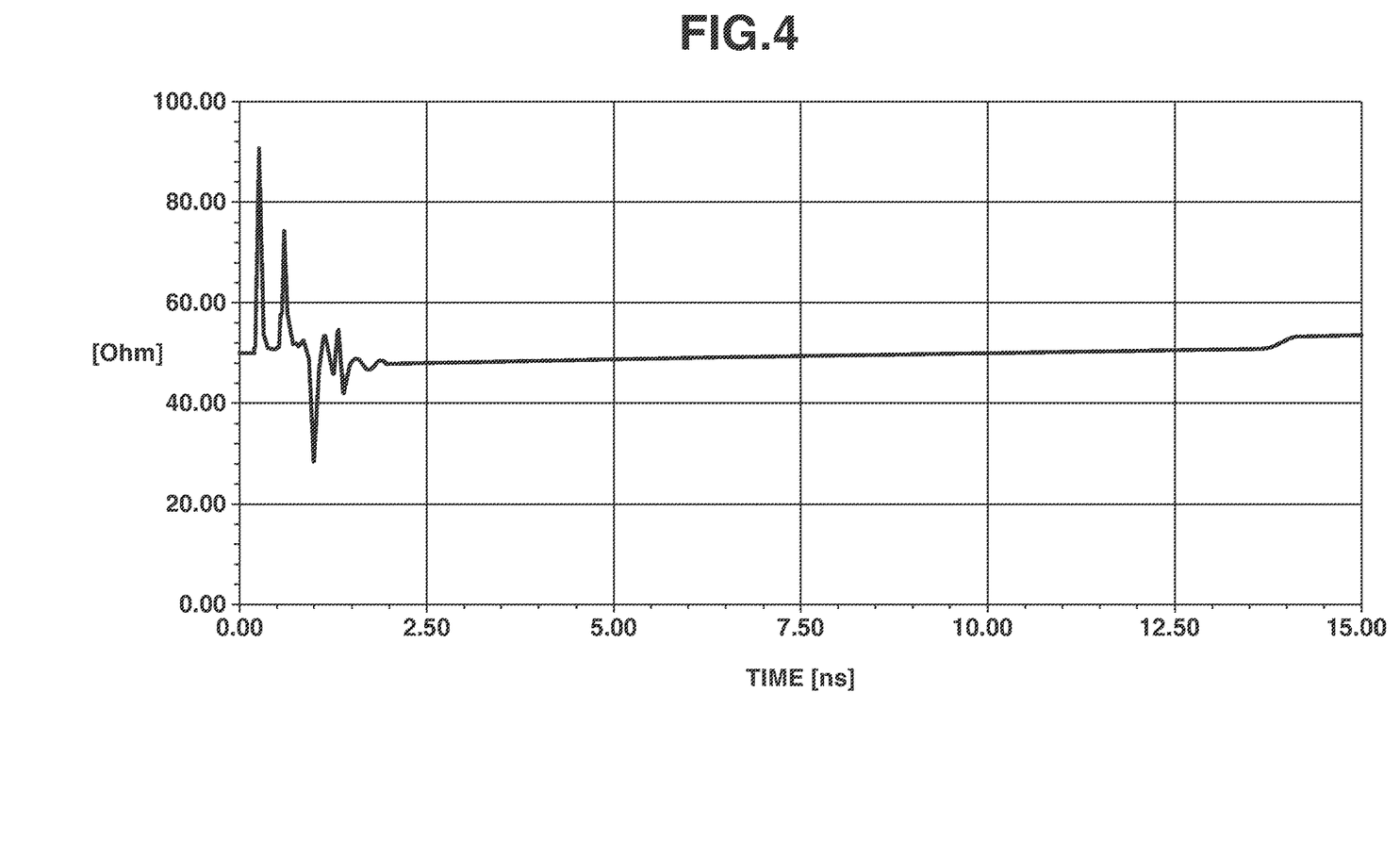
FIG. 4 is a diagram illustrating an example of characteristic impedance in the communication system.

A transmission signal in the transmission circuit 110 is at a speed of 10 gigabits per second (Gbps) of a pseudo random binary sequence (PRBS) 31, and at an approximately 1 peak-to-peak voltage (Vpp). The attenuation characteristic of the long coupler 130 is such that the signal is linearly attenuated to 6 dB at 5 GHz in transmission of 2000 mm. The description will be given assuming that the characteristic impedance from the transmission circuit 110 to the termination circuit 140 is as illustrated in FIG. 4. In the eye patterns illustrated in FIG. 3, the ordinate axis indicates a voltage, and the abscissa axis indicates time. In FIG. 4, the ordinate axis indicates characteristic impedance of the transmission line, and the abscissa axis indicates time.

When the short coupler 170 is at the position of 100 mm away from the input terminal of the long coupler 130, there are many impedance mismatch points at the periphery of the short coupler 170, and as a result, multiple reflection and distortion of the signal waveform occur. In this case, it is found that increasing the amount of attenuation of the attenuator 120 enlarges apertures in the eye pattern. This is because the reflected signal passes through the attenuator 120 and is thereby attenuated, and the influence of the multiple reflection can be reduced. When the amount of attenuation of the attenuator 120 is 0 dB, 2 dB, 6 dB, and 10 dB, an aperture voltage in the eye pattern is 8.2 mV, 33.5 mV, 42.5 mV, and 29.2 mV, respectively. That is, when the amount of attenuation of the attenuator 120 is increased, the influence of the multiple reflection can be reduced, but signal amplitude also drops. Hence, increasing the amount of attenuation of the attenuator 120 too significantly decreases the aperture voltage, and deteriorates signal waveform quality.

When the short coupler 170 is at the position of 1900 mm away from the input terminal of the long coupler 130, the signal waveform is less influenced by the multiple reflection and significantly influenced by the attenuation. In this case, it is thought that the amount of attenuation of the attenuator 120 is preferably set to be small. When the amount of attenuation of the attenuator 120 is 0 dB, 2 dB, 6 dB, and 10 dB, the aperture voltage in the eye pattern is 86.5 mV, 68.7 mV, 43.4 mV, and 27.0 mV, respectively.

In view of both of the above-mentioned case where the short coupler 170 is at the position of 100 mm away from the input terminal of the long coupler 130 and the above-mentioned case where the short coupler 170 is at the position of 1900 mm away from the input terminal of the long coupler 130, the amount of attenuation of the attenuator 120 is preferably 6 dB. In the case where the amount of attenuation of the attenuator 120 is 6 dB, the aperture voltage in the eye pattern can be set to 40 mV or higher wherever the position of the short coupler 170 is, and the signal waveform that is more favorable than those obtained by any other amounts of attenuation can be obtained.

The above-mentioned setting value of the amount of attenuation of the attenuator 120 is merely an example, and may be other setting values. For example, in a case where the influence of external noise is different depending on the relative position of the short coupler 170, the amount of attenuation of the attenuator 120 is preferably set so that the aperture voltage in the eye pattern is higher at the relative position of the short coupler 170 that is significantly influenced by noise.

As described above, the transmission circuit 110 is a transmission unit, and outputs a signal. The attenuator 120 is an attenuation unit, and attenuates the signal output from the transmission circuit 110. The attenuator 120 is, for example, a resistor. The one end portion (input terminal) of the long coupler 130 is connected to the transmission circuit 110 via the attenuator 120. The termination circuit 140 is a termination unit, and is connected to the other end portion (output terminal) of the long coupler 130. The termination circuit 140 is, for example, a termination resistor. The long coupler 130 outputs a signal to the short coupler 170 using the electric field coupling, the magnetic field coupling, or both of the electric field coupling and the magnetic field coupling.

The short coupler 170 inputs a signal to the long coupler 130 using the electric field coupling, the magnetic field coupling, or both of the electric field coupling and the magnetic field coupling. The long coupler 130 or the short coupler 170 is movable so that the relative position between the long coupler 130 and the short coupler 170 changes. In the moving direction of the long coupler 130 or the short coupler 170, the length of the long coupler 130 is greater than the length of the short coupler 170. The reception circuit 180 is a reception unit, and is connected to the short coupler 170. The reception circuit 180 restores a signal output from the transmission circuit 110 based on a signal input from the short coupler 170. The movement mechanism unit 103 moves the long coupler 130 or the short coupler 170 so that the relative position between the long coupler 130 and the short coupler 170 changes.

As described above, according to the present embodiment, the communication system 100 sets the amount of attenuation of the attenuator 120 so as to reduce the influence of the attenuation characteristic in the long coupler 130 while reducing the influence of the disturbance of the signal waveform due to the position of the short coupler 170. In this way, the communication system 100 can improve quality of the received signal waveform and obtain favorable communication characteristic.

Figure 5:
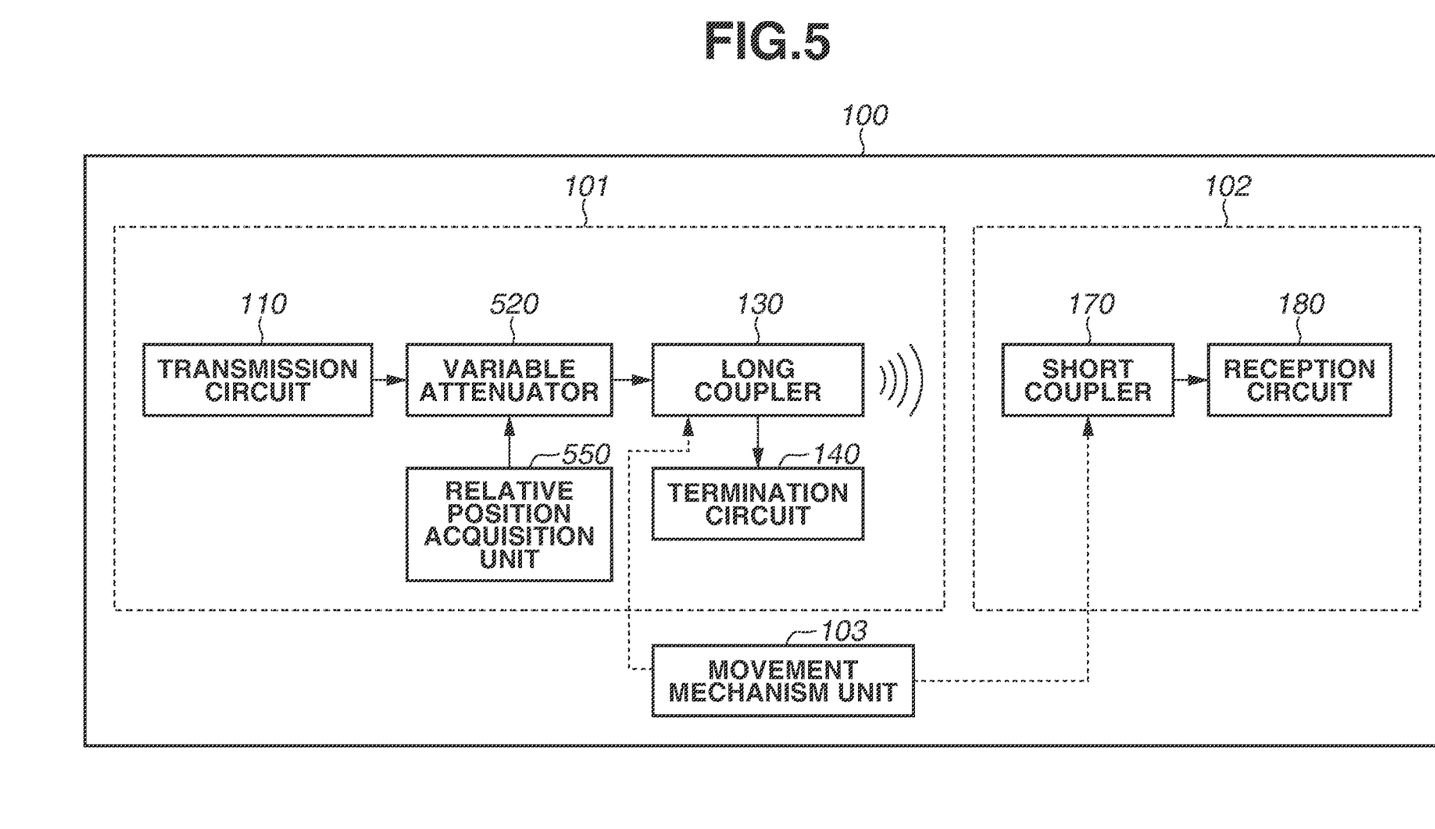
FIG. 5 is a diagram illustrating a configuration example of the communication system.

FIG. 5 is a diagram illustrating a configuration example of the communication system 100 according to a second embodiment. A different point of the second embodiment from the first embodiment will be described below. A communication system 100 illustrated in FIG. 5 is different from the communication system 100 illustrated in FIG. 1 in that a variable attenuator 520 and a relative position acquisition unit 550 are arranged in substitution for the attenuator 120. A communication apparatus 101 on the transmission side includes the variable attenuator 520 and the relative position acquisition unit 550 in substitution for the attenuator 120.

The relative position acquisition unit 550 acquires the relative position between the long coupler 130 and the short coupler 170. The relative position acquisition unit 550 dynamically controls an amount of attenuation of the variable attenuator 520 based on the relative position between the long coupler 130 and the short coupler 170. In this way, the communication system 100 can realize favorable signal waveform quality that is appropriate for the relative position between the long coupler 130 and the short coupler 170, and improve communication quality.

The communication system 100 uses the electromagnetic field coupling between the long coupler 130 and the short coupler 170 to perform wireless communication. The communication system 100 includes the communication apparatus 101 on the transmission side, the communication apparatus 102 on the reception side, and the movement mechanism unit 103. The communication apparatus 101 on the transmission side in FIG. 5 is different from the communication apparatus 101 on the transmission side in FIG. 1 in that the communication apparatus 101 on the transmission side in FIG. 5 includes the variable attenuator 520 and the relative position acquisition unit 550.

The variable attenuator 520 is arranged between the transmission circuit 110 and the long coupler 130, attenuates a signal input from the transmission circuit 110, and outputs the attenuated signal to the long coupler 130. The amount of attenuation of the variable attenuator 520 is controlled by the relative position acquisition unit 550. For example, a microcomputer included in the relative position acquisition unit 550 controls the amount of attenuation of the variable attenuator 520 via an interface such as an inter-integrated circuit (I2C) and a serial peripheral interface (SPI). A method of controlling the amount of attenuation of the variable attenuator 520 is not limited to the above-described method, and the amount of attenuation of the variable attenuator 520 may be controlled by software or another hardware configuration.

The amount of attenuation of the variable attenuator 520 is dynamically controlled based on the relative position, which is acquired by the relative position acquisition unit 550, between the long coupler 130 and the short coupler 170. Specifically, because an amount of attenuation in the transmission line of the long coupler 130 becomes larger as the position of the short coupler 170 moves in a direction from the input terminal of the long coupler 130 toward the output terminal of the long coupler 130 and the influence of reflection becomes smaller, the relative position acquisition unit 550 performs control to reduce the amount of attenuation of the variable attenuator 520.

For example, in FIG. 3, when the short coupler 170 is at the position of 100 mm away from the input terminal of the long coupler 130, the amount of attenuation of the variable attenuator 520 is controlled to be 6 dB. When the short coupler 170 is at the position of 1900 mm away from the input terminal of the long coupler 130, the amount of attenuation of the variable attenuator 520 is controlled to be 0 dB.

The relative position acquisition unit 550 does not necessarily detect the relative position between the long coupler 130 and the short coupler 170. The relative position acquisition unit 550 may have a table that includes predetermined relative positions between the long coupler 130 and the short coupler 170 and amounts of attenuation of the variable attenuator 520, and determine the amount of attenuation of the variable attenuator 520 based on a movement sequence determined by the communication system 100. The amount of attenuation of the variable attenuator 520 is not limited to the above-mentioned control values.

As described above, the variable attenuator 520 is a variable attenuation unit in which an amount of attenuation is variable. The relative position acquisition unit 550 acquires the relative position between the long coupler 130 and the short coupler 170. The amount of attenuation of the variable attenuator 520 changes depending on the relative position between the long coupler 130 and the short coupler 170. The amount of attenuation of the variable attenuator 520 becomes smaller as the short coupler 170 moves relative to the long coupler 130 in the direction from the one end portion (input terminal) of the long coupler 130 toward the other end portion (output terminal) of the long coupler 130.

As described above, according to the present embodiment, the communication system 100, with the use of the variable attenuator 520, can improve signal waveform quality and communication quality based on the relative position between the long coupler 130 and the short coupler 170.

The present disclosure is not limited to the above-mentioned embodiments. All combinations of features described in the above-mentioned embodiments are not necessarily essential. The contents of the embodiments are merely examples, and do not limit the present disclosure. Various modifications (including organic combinations of the embodiments) can be made based on the intent of the present disclosure, and are not excluded from the scope of the present disclosure. That is, all configurations obtained by combining any of the above-mentioned embodiments and any of modifications thereof are included in the present disclosure.

While the present disclosure has been described with reference to embodiments, it is to be understood that the disclosure is not limited to the disclosed embodiments. The scope of the following claims is to be accorded the broadest interpretation so as to encompass all such modifications and equivalent structures and functions.

This application claims the benefit of priority from Japanese Patent Application No. 2022-008691, filed Jan. 24, 2022, which is hereby incorporated by reference herein in its entirety.

What is claimed is:

1. A communication system comprising:
a transmission unit configured to output a signal;
an attenuation unit configured to attenuate the signal output from the transmission unit;
a first coupler having one end portion being connected to the transmission unit via the attenuation unit;
a termination unit that is connected to the other end portion of the first coupler; and
a second coupler configured to receive a signal output from the first coupler using at least one of electric field coupling and magnetic field coupling,
wherein the attenuation unit is a variable attenuation unit in which an amount of attenuation is variable, and
wherein the first coupler or the second coupler is configured to be movable so that a relative position between the first coupler and the second coupler changes.

2. The communication system according to claim 1, wherein a length of the first coupler is greater than a length of the second coupler in a moving direction of the first coupler or the second coupler.

3. The communication system according to claim 1, further comprising a reception unit that is connected to the second coupler.

4. The communication system according to claim 3, wherein the reception unit is configured to restore the signal output from the transmission unit based on the signal input from the second coupler.

5. The communication system according to claim 1, wherein the termination unit is a termination resistor.

6. The communication system according to claim 1, wherein the amount of attenuation of the variable attenuation unit changes depending on the relative position between the first coupler and the second coupler.

7. The communication system according to claim 6, further comprising a relative position acquisition unit configured to acquire the relative position between the first coupler and the second coupler.

8. The communication system according to claim 1, wherein the amount of attenuation of the variable attenuation unit becomes smaller as the second coupler moves relative to the first coupler in a direction from the one end portion of the first coupler toward the other end portion of the first coupler.

9. The communication system according to claim 1, further comprising a movement mechanism unit configured to move the first coupler or the second coupler so that the relative position between the first coupler and the second coupler changes.

10. The communication system according to claim 1, wherein the attenuation unit is a resistor.

11. A communication apparatus comprising:
a transmission unit configured to output a signal;
an attenuation unit configured to attenuate the signal output from the transmission unit;
a first coupler having one end portion being connected to the transmission unit via the attenuation unit, and that is configured to output a signal to a second coupler using at least one of electric field coupling and magnetic field coupling; and
a termination unit that is connected to the other end portion of the first coupler,
wherein the attenuation unit is a variable attenuation unit in which an amount of attenuation is variable, and
wherein the first coupler or the second coupler is configured to be movable so that a relative position between the first coupler and the second coupler changes.

12. The communication apparatus according to claim 11, wherein a length of the first coupler is greater than a length of the second coupler in a moving direction of the first coupler or the second coupler.

13. The communication apparatus according to claim 11, wherein the amount of attenuation of the variable attenuation unit changes depending on the relative position between the first coupler and the second coupler.

14. The communication apparatus according to claim 13, further comprising a relative position acquisition unit configured to acquire the relative position between the first coupler and the second coupler.

15. The communication apparatus according to claim 11, wherein the amount of attenuation of the variable attenuation unit becomes smaller as the second coupler moves relative to the first coupler in a direction from the one end portion of the first coupler toward the other end portion of the first coupler.

* * * * *